(12) United States Patent
Fuchs et al.

(10) Patent No.: US 12,061,085 B2
(45) Date of Patent: Aug. 13, 2024

(54) METHOD FOR DETERMINING A CHANGE IN A ROTATIONAL ORIENTATION IN THE SPACE OF AN NMR GYROSCOPE, AND NMR GYROSCOPE

(71) Applicant: Robert Bosch GmbH, Stuttgart (DE)

(72) Inventors: Tino Fuchs, Tuebingen (DE); Janine Riedrich-Moeller, Leonberg-Warmbronn (DE); Andreas Brenneis, Renningen (DE); Robert Roelver, Calw-Stammheim (DE); Michael Curcic, Stuttgart (DE); Peter Degenfeld-Schonburg, Renningen (DE)

(73) Assignee: Robert Bosch GmbH, Stuttgart (DE)

( * ) Notice: Subject to any disclaimer, the term of this patent is extended or adjusted under 35 U.S.C. 154(b) by 162 days.

(21) Appl. No.: 17/756,891

(22) PCT Filed: Oct. 21, 2020

(86) PCT No.: PCT/EP2020/079605
§ 371 (c)(1),
(2) Date: Jun. 3, 2022

(87) PCT Pub. No.: WO2021/110318
PCT Pub. Date: Jun. 10, 2021

(65) Prior Publication Data
US 2023/0027677 A1     Jan. 26, 2023

(30) Foreign Application Priority Data
Dec. 6, 2019 (DE) .................... 10 2019 219 061.8

(51) Int. Cl.
*G01V 3/00* (2006.01)
*G01C 19/62* (2006.01)

(52) U.S. Cl.
CPC .................................. *G01C 19/62* (2013.01)

(58) Field of Classification Search
CPC .............. G01R 33/3415; G01R 33/543; G01R 33/5659; G01R 33/36; A61B 5/055
(Continued)

(56) References Cited

FOREIGN PATENT DOCUMENTS

| DE | 102019219055 A1 * | 6/2021 |
| WO | 2012099819 A1 | 7/2012 |

OTHER PUBLICATIONS

International Search Report corresponding to PCT Application No. PCT/EP2020/079605, mailed Feb. 15, 2021 (German and English language document) (5 pages).
(Continued)

*Primary Examiner* — Walter L Lindsay, Jr.
*Assistant Examiner* — Frederick Wenderoth
(74) *Attorney, Agent, or Firm* — Maginot, Moore & Beck LLP

(57) ABSTRACT

A method for determining a rotational orientation change using an NMR gyroscope includes making use of a measure of determining, in a vapor cell, which is filled at least with a gaseous first element and a gaseous second element having non-vanishing nuclear spin, a nuclear spin component of the second element in the second direction and a nuclear spin component of the second element in a third direction. The second direction and the third direction are perpendicular to a first direction, which corresponds to the direction of the static magnetic field and to the polarization direction of the nuclear spin of the second element. Moreover, the second direction corresponds to the direction of an applied alternating magnetic field, the frequency of which corresponds to the Larmor frequency of the Larmor precession of the nuclear spin of the second element about the static magnetic field.

15 Claims, 3 Drawing Sheets

(58) Field of Classification Search
USPC .......................................................... 324/305
See application file for complete search history.

(56) References Cited

OTHER PUBLICATIONS

Jiang Liwei et al., "A parametrically modulated dual-axis atomic spin gyroscope", Applied Physics Letters, AIP Publishing Llc, US, vol. 112, No. 5, Jan. 31, 2018, DOI: 10.1063/1.5018015, ISSN: 0003-6951, XP012226015 (5 pages).

* cited by examiner

METHOD FOR DETERMINING A CHANGE IN A ROTATIONAL ORIENTATION IN THE SPACE OF AN NMR GYROSCOPE, AND NMR GYROSCOPE

This application is a 35 U.S.C. § 371 National Stage Application of PCT/EP2020/079605, filed on Oct. 21, 2020, which claims the benefit of priority to Serial No. DE 10 2019 219 061.8, filed on Dec. 6, 2019 in Germany, the disclosures of which are incorporated herein by reference in their entirety.

The disclosure relates to a method for determining the change of a rotational orientation in the space of an NMR gyroscope and an NMR gyroscope.

BACKGROUND

Rotation rate sensors or gyroscopes based on MEMS can be used to determine a change of a rotational orientation in space. They are cost-effective and small. Their deviation is approximately 1°/hour and their accuracy enables, for example, in autonomously driving automobiles, lane keeping for approximately 40 seconds if all other driver assistance systems fail. They can be used, for example, as a backup for radar positioning, video assistance positioning, and GPS positioning.

Laser gyroscopes are significantly more accurate and can be used for aircraft navigation. They are based on the optical Sagnac effect and their deviation is only approximately 0.0035°/hour. However, they are relatively large and expensive and are therefore hardly suitable for use in vehicles.

One alternative possibility is to use NMR gyroscopes ("nuclear magnetic resonance"). These evaluate nuclear magnetic resonance signals from atomic nuclei having non-negligible magnetic moment. These can be produced in miniature embodiments and have a deviation of approximately 0.02°/hour. They are therefore up to 50 times more accurate than MEMS gyroscopes.

One possibility for providing an NMR gyroscope having an axis is to provide a vapor chamber having a mixture made of, for example, xenon and rubidium. The rubidium electron spins in the vapor cell can be polarized by means of a polarized pump laser beam. Due to a rigid coupling between rubidium and xenon, this results in a polarization of the xenon nuclear spins parallel to the rubidium electron spins. A nuclear spin precession of the xenon nuclear spins can be generated around the static magnetic field by means of a static magnetic field in the polarization direction. The precession frequency is in this case the Larmor frequency, which is dependent on the static magnetic field. A coherent precession of all nuclear spins can be achieved by an alternating magnetic field, the frequency of which corresponds to the Larmor frequency and which can be applied perpendicularly to the static magnetic field. If a polarized sample or evaluation laser beam is now irradiated through the vapor cell perpendicularly to the static magnetic field, the polarization of the sample laser beam is rotated periodically at the Larmor frequency due to the Faraday effect. An intensity variation, which is modulated by the Larmor frequency, can thus be observed by a polarizer or polarization filter and a detector. A rotation of the sensor around an axis of rotation parallel to the static magnetic field results in a shift of the Larmor frequency proportional to the rotation rate. By evaluating the intensity signal output by the detector, a change of the rotational orientation having an axis of rotation in parallel to the polarization direction can thus be determined.

SUMMARY

According to the disclosure, a method for determining the change of a rotational orientation in the space of an NMR gyroscope and an NMR gyroscope are proposed. Advantageous embodiments are the subject matter of the following description.

The disclosure makes use of the measure, in a vapor cell, which is filled at least with a gaseous first element and a gaseous second element having non-negligible nuclear spin, of applying a static magnetic field in a first direction which corresponds to a polarization direction of the nuclear spins of the second element and respectively determining a nuclear spin component of the second element in a second direction and in a third direction. The second and third directions differ from one another in this case and both are perpendicular to the first direction. Furthermore, the second direction corresponds to the direction of an applied alternating magnetic field, the frequency of which corresponds to the Larmor frequency of the Larmor precession of the nuclear spins of the second element around the static magnetic field. A rotational orientation change can then be determined from the vector of the Larmor precession having an axis of rotation parallel to the first direction, having an axis of rotation parallel to the second direction, and having an axis of rotation parallel to the third direction.

As will be shown later, a rotational orientation change in all three spatial directions can be determined by this measure by means of only one vapor cell and a few additional components. The costs and the structural volume for providing an NMR gyroscope are thus minimized.

An alkali metal can be used in particular as the first element, preferably rubidium or cesium. The second element having non-negligible nuclear spin can be in particular xenon, helium, krypton, or neon or a special isotope mixture of the gases, for example, Xe-129 and Xe-131. A gas having specially set isotope mixture of, for example, xenon with at least one other gas, e.g., helium, neon, or krypton, is also conceivable.

The first direction, the second direction, and the third direction expediently each have an angle of 90° in relation to one another. The rotational orientation changes may be calculated particularly easily in this way.

The rotational orientation changes $\Omega_1(t)$ having an axis of rotation parallel to the first direction, $\Omega_2(t)$ having an axis of rotation parallel to the second direction, and $\Omega_3(t)$ having an axis of rotation parallel to the third direction are preferably obtained from the equations $$\frac{\partial k_2(t)}{\partial t} = k_3(\gamma_k B_{DC} + 2\pi\Omega_1(t)) - k_1(0 + 2\pi\Omega_3(t)) - \Gamma_2 k_2,$$

$$\frac{\partial k_3}{\partial t} = k_1(\gamma_k B_{AC}\sin(\omega_{drv}t) + 2\pi\Omega_2(t)) - k_2(\gamma_k B_{DC} + 2\pi\Omega_1(t)) - \Gamma_2 k_3, \text{ and}$$

$$\frac{\partial k_1}{\partial t} = k_2(0 + 2\pi\Omega_3(t)) - k_3(\gamma_k B_{DC}\sin(\omega_{drv}t) + 2\pi\Omega_2(t)) - \Gamma_1 k_1 + \Gamma_{se} s_1,$$

wherein $\omega_{drv}$ corresponds to the frequency of the alternating magnetic field, $B_{DC}$ corresponds to the applied static magnetic field, $B_{AC}$ corresponds to the amplitude of the alternating magnetic field in the second direction, $\Gamma_1$ and $\Gamma_2$ correspond to the population and coherence decay rates, $\Gamma_{se}$ describes the spin exchange rate, which results in the alignment of the nuclear spin of the second element via the exchange interaction with the electron spin $s_1$ of the first element, $k_1$ is the nuclear spin component of the second element in the first direction, and $\gamma_k$ describes the gyromagnetic ratio of the nuclear spin. Sufficient items of information to uniquely determine the rotational orientation changes with respect to all three spatial axes are provided by measuring the time curves of the nuclear spin component $k_2(t)$ of the second element in the second direction and the nuclear spin component $k_3(t)$ of the second element in the third direction.

In particular, a rotational orientation change $\Omega_2(t)$ having an axis of rotation parallel to the second direction is ascertained in that in addition to the alternating magnetic field in the second direction, a feedback magnetic field $B_{FB,2}(t)$ is applied by means of the first alternating magnetic field generator, which is controlled in such a way that an offset of the nuclear spin component $k_2(t)$ of the second element in the second direction with respect to the Larmor precession around the first direction becomes zero, so that via the equation $$\Omega_2(t) = -\frac{\gamma_k}{2\pi} B_{FB,2}(t),$$

the rotational orientation change $\Omega_2(t)$ is determinable. In this way, the rotational orientation change $\Omega_2(t)$ having an axis of rotation parallel to the second direction can be determined without great computing effort.

Expediently, a rotational orientation change $\Omega_3(t)$ having an axis of rotation parallel to the third direction is ascertained in that in the third direction, a feedback magnetic field $B_{FB,3}(t)$ is applied, which is controlled in such a way that an offset of the nuclear spin component $k_3(t)$ of the second element in the third direction with respect to the Larmor precession around the first direction becomes zero, so that via the equation $$\Omega_3(t) = -\frac{\gamma_k}{2\pi} B_{FB,3}(t),$$

the rotational orientation change $\Omega_3(t)$ is determinable.

Preferably, a rotational orientation change $\Omega_1(t)$ having an axis of rotation parallel to the first direction is determined in that a frequency shift of the nuclear spin component of the second element in the second direction and/or the nuclear spin component in the third direction is equalized by changing the frequency of the alternating magnetic field applied in the second direction in such a way that the frequency of the applied alternating magnetic field corresponds to the measured frequency of the nuclear spin component $k_2(t)$ of the second element in the second direction and/or the nuclear spin component $k_3(t)$ of the second element in the third direction. The frequency shift is determined here in particular by a phase-locked loop.

The measurement of the nuclear spin component $k_3$ of the second element in the third direction is expediently carried out in that a first linearly polarized evaluation laser beam from a first evaluation laser radiates through the vapor cell in the third direction, wherein this evaluation laser beam is incident after radiating through the vapor cell on a polarizing first beam splitter, which splits the first evaluation laser beam into a transmitted beam and a reflected beam, wherein a first and second detector are provided, so that the transmitted beam is incident on the first detector, the reflected beam is incident on the second detector. This is advantageous since in this way by way of the rotation of the polarization plane as a function of the nuclear spin component $k_3$ of the second element in the third direction, the time curve of this nuclear spin component $k_3$ can be measured very easily and accurately.

In particular, the nuclear spin component $k_2(t)$ of the second element in the second direction is measured in that a linearly polarized second evaluation laser beam from a second evaluation laser radiates through the vapor cell in the second direction, wherein this evaluation laser beam is incident after the transmission through the vapor cell on a polarizing second beam splitter, which splits the second evaluation laser beam into a transmitted beam and a reflected beam, wherein a third and fourth detector are provided, so that the transmitted beam is incident on the third detector, the reflected beam is incident on the fourth detector. This is advantageous since in this way due to the rotation of the polarization plane as a function of the nuclear spin component $k_2$ of the second element in the second direction, the time curve of this nuclear spin component $k_2$ can be measured very easily and accurately.

The vapor cell is preferably constantly temperature controlled to a value between 110° C. and 120° C., preferably 115° C., which is achieved in particular by means of an infrared laser. This is advantageous since in this way the measurement constants remain the same and measurement distortions due to temperature changes are avoided.

Further advantages and embodiments of the disclosure result from the description and the appended drawing.

The disclosure is schematically illustrated on the basis of an exemplary embodiment in the drawing and is described hereinafter with reference to the drawing.

DETAILED DESCRIPTION

The technical principle of an NMR gyroscope and a method for determining the change of a rotational orientation in space by means of such an NMR gyroscope is to be described hereinafter on the basis of FIGS. 1 to 4.

To determine a change of a rotational orientation in space by means of an NMR gyroscope having an axis of rotation parallel to a spatial axis, a vapor cell is required, having a mixture of rubidium here as a gaseous first element and xenon here as a gaseous second element having non-negligible nuclear spin.

Figure 1:
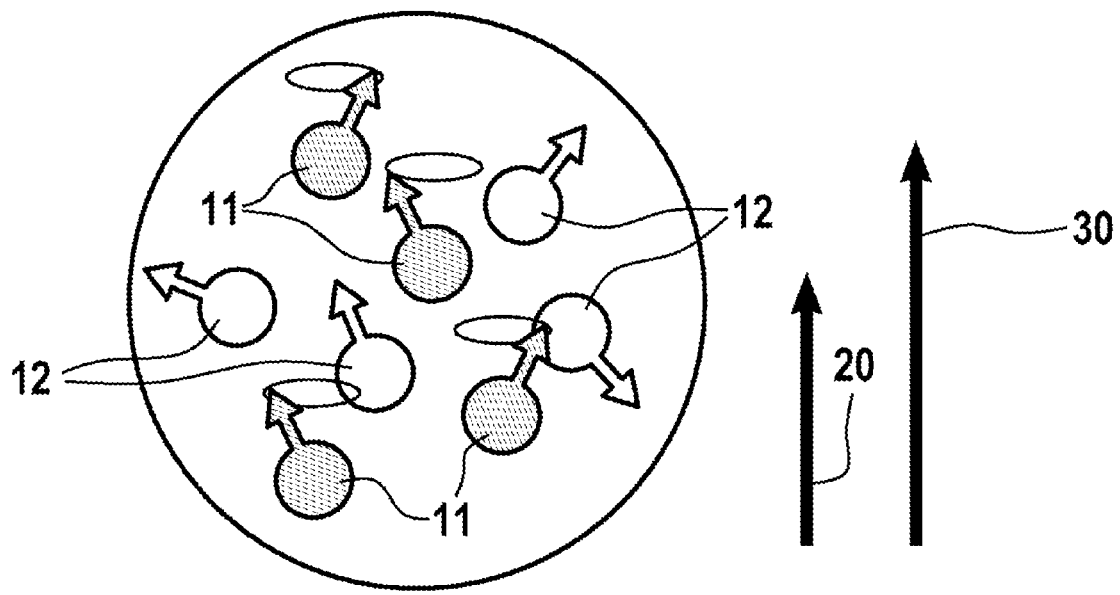
FIG. 1 shows a vapor cell having a mixture made of a first gas and a second gas having non-negligible nuclear spin with application of a pump laser and a static magnetic field in a schematic view.

Such a vapor cell is shown in FIG. 1. A static magnetic field 30 is applied in the direction of the mentioned spatial axis. Furthermore, a pump laser radiates through the vapor cell in parallel to the static magnetic field 30 using circularly polarized light 20 in a frequency which is capable of polarizing the electron spins of the rubidium atoms 11, thus the rubidium electron spins, in the direction of the static magnetic field 30.

Figure 2:
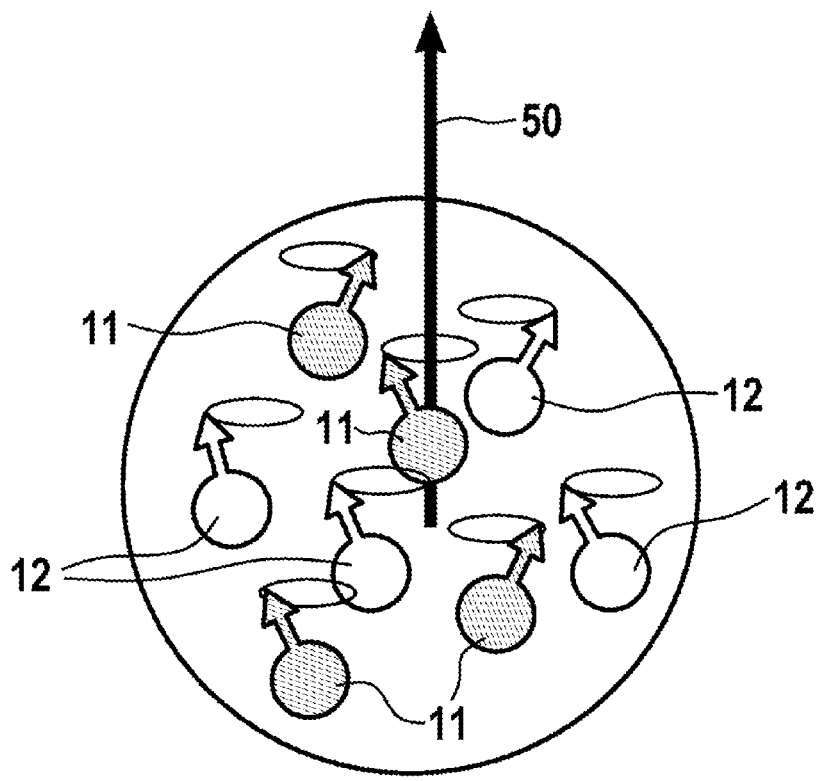
FIG. 2 shows the vapor cell from FIG. 1, after the nuclear spins of the gas having non-negligible nuclear spin have aligned in parallel to the electron spins of the first gas, in a schematic view.

Due to a strong interaction between the electron spins of the rubidium atoms 11 and the nuclear spins of the xenon atoms 12, the nuclear spins of the xenon atoms 12, thus the xenon nuclear spins, are polarized in parallel to the electron spins of the rubidium atoms 11 and begin to precess around the static magnetic field 30. This state is shown in FIG. 2. Since the phase of the precession of the electron spins of the rubidium atoms 11 and the nuclear spins of the xenon atoms 12 differs from atom to atom, a constant magnetic moment 50 results therefrom, which is aligned in parallel to the polarization direction, the mentioned spatial axis, the direction of the pump laser light 20, and the direction of the static magnetic field 30.

Figure 3:
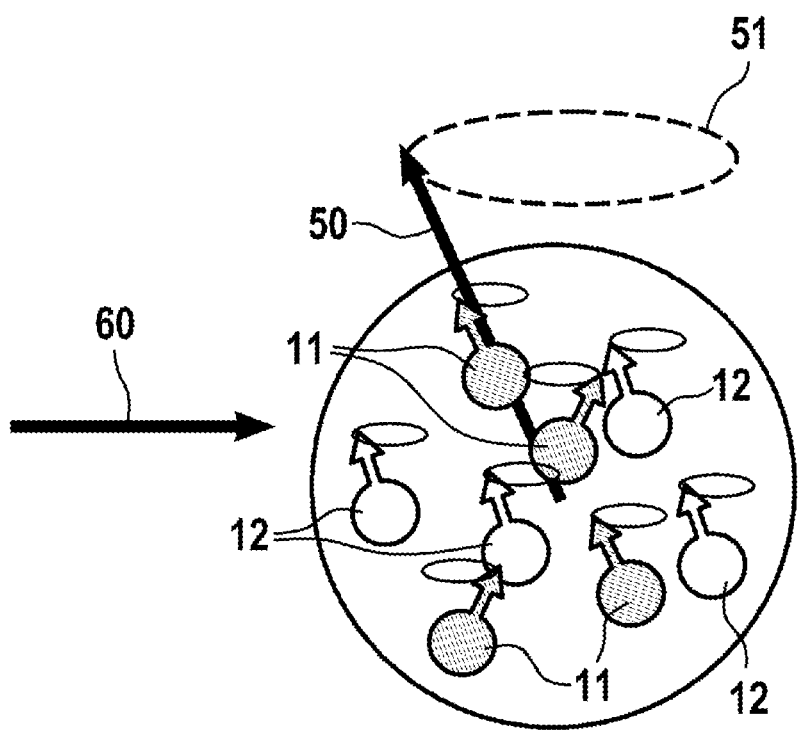
FIG. 3 shows the vapor cell from FIGS. 1 and 2, to which an alternating magnetic field is applied perpendicularly to the static magnetic field, the frequency of which corresponds to the Larmor frequency of the Larmor precession of the nuclear spins of the gas having non-negligible nuclear spin around the static magnetic field, in a schematic view.

In a direction perpendicular to the static magnetic field 30, in a next step, an alternating magnetic field 60 is applied, the frequency of which corresponds to the Larmor frequency of the Larmor precession of the xenon nuclear spins 11 around the static magnetic field 30. This has the result that the xenon nuclear spins 11 precess in phase with the Larmor frequency around the static magnetic field 30. This state is shown in FIG. 3. A common magnetic moment 50 results therefrom, which precesses at the Larmor frequency around the static magnetic field 30. The precession movement of the common magnetic moment 50 is identified by the reference sign 51.

Figure 4:
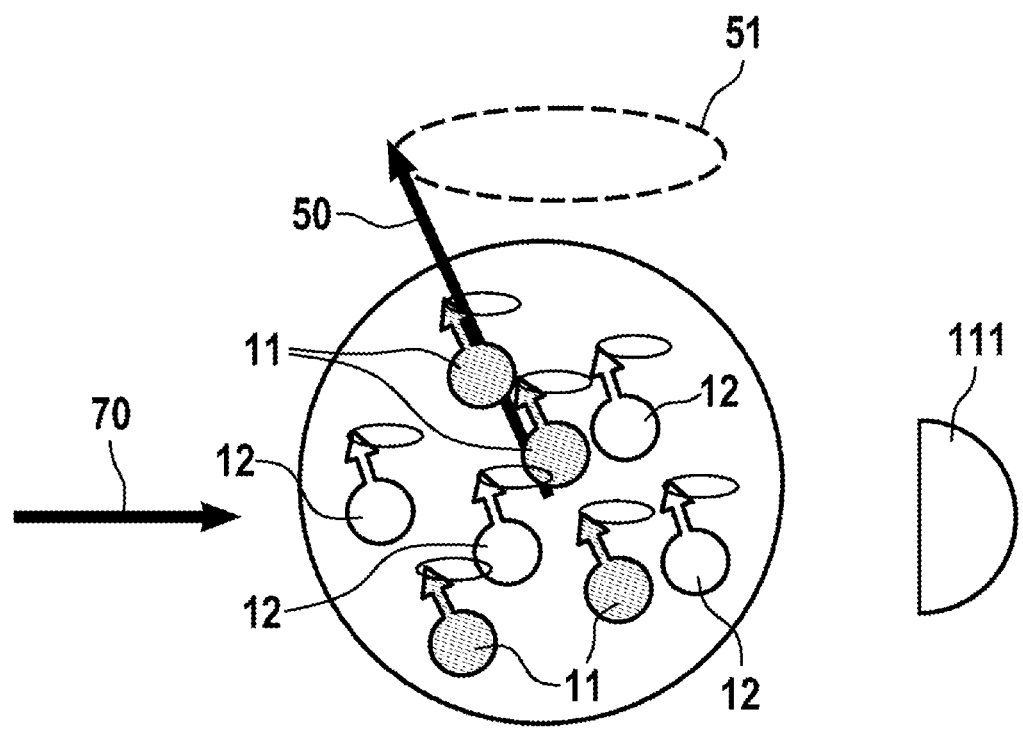
FIG. 4 shows the vapor cell from FIG. 3, through which a polarized evaluation laser beam radiates perpendicular to the static magnetic field, the light of which is subsequently detected by a detector having upstream polarization filter, in a schematic view.

The magnetic field change induced by the in-phase xenon nuclear spin precession 51 feeds back on the rubidium electron spins 12, which also precess at the Larmor frequency of the xenon nuclear spins 11 around the static magnetic field 30. This state is shown in FIG. 4.

If a linearly polarized evaluation laser beam 70 is now radiated through the vapor cell perpendicular to the direction of the static magnetic field 30, due to the Faraday effect, the polarization direction of the evaluation laser beam 70 thus rotates with the precession of the electron spins of the rubidium 11 around the static magnetic field 30. The evaluation laser beam can therefore be detected by a detector 111 having upstream polarizer designed as a polarization filter, which corresponds to an intensity signal that changes with the Larmor frequency of the xenon nuclear spins 11.

In the event of a rotational orientation change of the vapor cell having an axis of rotation parallel to the static magnetic field 30, the frequency of the intensity signal shifts with the rotation rate. This frequency shift can be detected by means of an evaluation unit, by which the rotational orientation change having an axis of rotation parallel to the static magnetic field can be detected.

Figure 5:
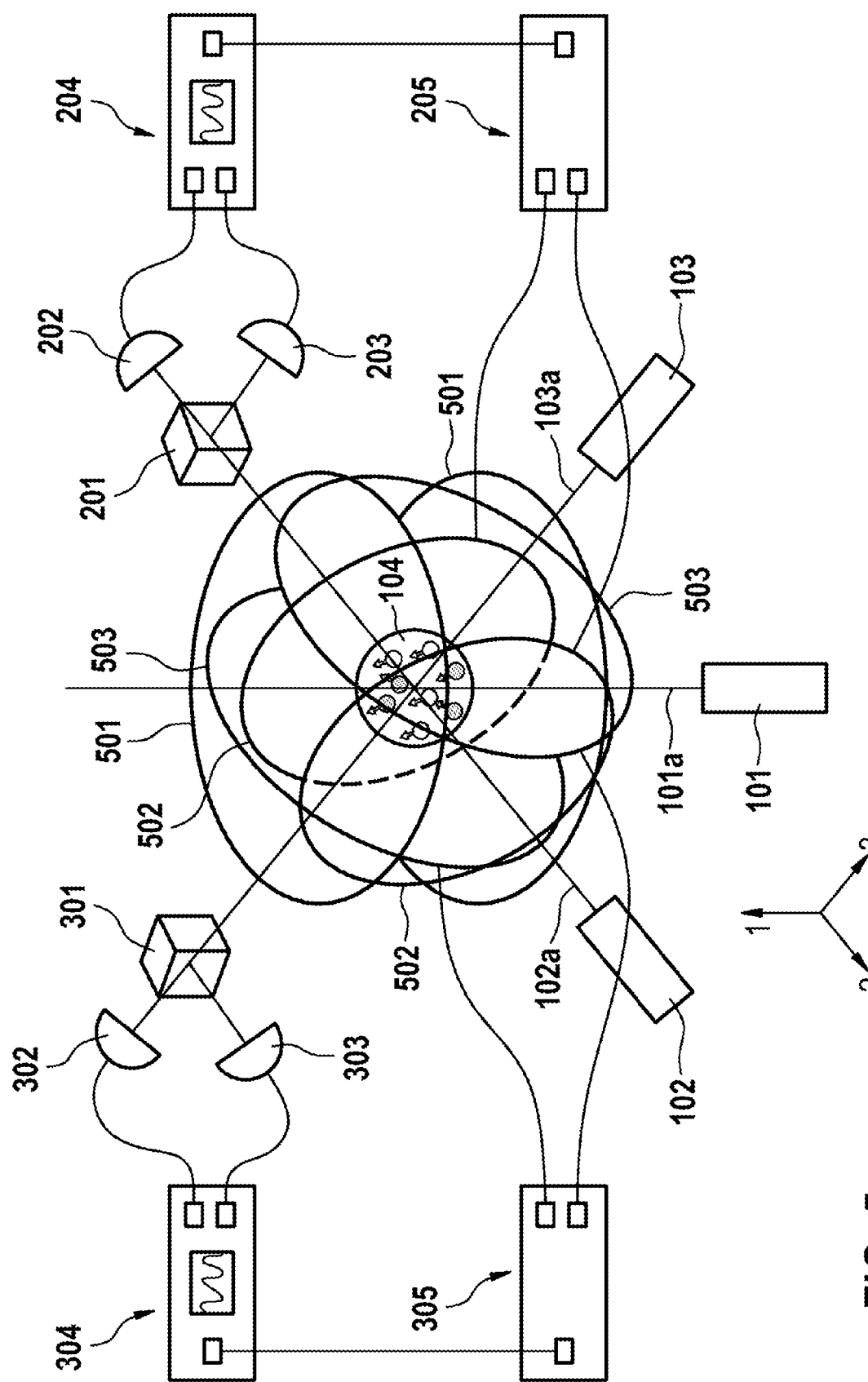
FIG. 5 shows a preferred embodiment of an NMR gyroscope according to the disclosure in a schematic perspective view.

FIG. 5 shows a preferred embodiment of an NMR gyroscope according to the disclosure in a schematic perspective view. The NMR gyroscope has a vapor cell 104, which contains here a mixture made up of gaseous rubidium as the first element and gaseous xenon as the second element.

Furthermore, the NMR gyroscope has a pump laser 101. This is configured to emit a circularly polarized laser beam 101a in a first direction 1 in such a way that this laser beam radiates through the vapor cell 104 in the first direction 1 and polarizes the rubidium electron spins 11 in the first direction 1. The xenon nuclear spins 12 are thus also polarized in the first direction by a strong electron-nuclear spin interaction.

In addition, the gyroscope has a magnetic field generator for generating a static magnetic field in the first direction 1. This magnetic field generator has a Helmholtz coil pair 501 in this embodiment. If a static magnetic field of the strength $B_{DC}$ is applied in the first direction 1, the xenon nuclear spins 12 precess at the Larmor frequency around the static magnetic field.

Furthermore, the gyroscope has a first alternating magnetic field generator having a Helmholtz coil pair 502 and an activation device 205, which is configured to generate an alternating magnetic field in a second direction 2 perpendicular to the first direction 1. The alternating magnetic field has the amplitude $B_{AC}$. It has an angular frequency $\omega_{drv}$ which corresponds to the Larmor frequency of the Larmor precession of the xenon nuclear spins 12 around the static magnetic field 30. The Larmor precession of the xenon nuclear spins is thus in phase.

In addition, the gyroscope has a first evaluation laser 102 here, which is configured to emit a linearly polarized first evaluation laser beam 102a in the second direction 2 in such a way that it radiates through the vapor cell 104 in the second direction 2. This first evaluation laser beam 102a is incident after the vapor cell 104 on a first polarizing beam splitter 201 in such a way that a transmitted beam having a first linear polarization direction is incident on a first detector 202 and a reflected beam having a second linear polarization direction perpendicular to the first is incident on a second detector 203. The polarizing beam splitter is designed here as a beam splitter cube.

The NMR gyroscope additionally has a second evaluation laser 103 here, which is configured to radiate a second evaluation laser beam 103a through the vapor cell 104 in a third direction 3. The third direction 3 is perpendicular to the first direction 1 and second direction 2. The second evaluation laser beam 103a is incident after the vapor cell 104 on a second polarizing beam splitter 301. The second beam splitter 301 is in this embodiment designed similarly to the first beam splitter 201 as a beam splitter cube. The second beam splitter 301 is configured to continue a component of the second evaluation laser beam 103a having a first linear polarization direction in a transmitted beam which is incident on a third detector 302. Furthermore, the second beam splitter 301 is configured to continue a component of the second evaluation laser beam 103a having a second linear polarization direction perpendicular to the first polarization direction in a reflected beam, which is incident on a fourth detector 303.

Furthermore, the NMR gyroscope has a second alternating magnetic field generator having a Helmholtz coil pair 503 and an activation device 305, which is configured to apply an alternating magnetic field in the third direction 3 to the vapor cell.

To evaluate the detector signals, the NMR gyroscope has an evaluation unit which consists in this embodiment of a first 204 and second 304 evaluation module and the first 205 and second 305 activation device of the first and second alternating magnetic field generator.

The first evaluation module 204 is configured to determine, as the difference of the measured intensities at the first 202 and second detector 203, a time curve of the nuclear spin component $k_2(t)$ of the second element in the second direction. If the time curve has an offset, i.e., a shift of the signal zero line or baseline, a feedback magnetic field $B_{FB,2}(t)$ is output by means of the first activation device 205 and the first alternating magnetic field generator 502 in such a way that the measured offset disappears. A rotational orientation change or rotation rate having an axis of rotation parallel to the second direction can then be determined by means of the first evaluation module 204 from the equation $$\Omega_2(t) = -\frac{\gamma_k}{2\pi} B_{FB,2}(t).$$

The second evaluation module 304 is configured to determine, as the difference of the measured intensities at the third 302 and fourth detector 303, a time curve of the nuclear spin component $k_3(t)$ of the second element in the third direction. If the time curve has an offset, a feedback magnetic field $B_{FB,3}(t)$ is output by means of the first activation device 305 and the first alternating magnetic field generator 503 in such a way that the measured offset disappears. A rotational orientation change or rotation rate having an axis of rotation parallel to the third direction 3 can then be determined by means of the second evaluation module 304 from the equation $$\Omega_3(t) = -\frac{\gamma_k}{2\pi} B_{FB,3}(t).$$

The invention claimed is:

1. A method for determining a change of a rotational orientation in a space of a nuclear magnetic resonance (NMR) gyroscope having a vapor cell, which contains a mixture including at least one gaseous first element and at least one gaseous second element having non-negligible nuclear spin, the method comprising:
   polarizing electron spins of the first element in a first direction, so that due to a strong electron-nuclear spin interaction between the first element and the second element, nuclear spins of the second element are polarized in parallel to electron spins of the first element;
   applying, with a static magnetic field generator, a static magnetic field in a polarization direction of the nuclear spins of the second element, so that the nuclear spins of the second element precess around the static magnetic field at a first Larmor frequency dependent on the static magnetic field;
   applying, with a first alternating magnetic field generator, an alternating magnetic field in a second direction perpendicular to the polarization direction of the nuclear spins of the second element, wherein the alternating magnetic field has a frequency which corresponds to the first Larmor frequency of the Larmor precession of the nuclear spins of the second element around the static magnetic field, so that the Larmor precession of the nuclear spins of the second element is in phase inside the vapor cell;
   measuring, with a measuring unit, a nuclear spin component of the second element in the second direction and a nuclear spin component of the second element in a third direction, which is perpendicular to the first direction and differs from the second direction; and
   determining, with an evaluation unit, a rotational orientation change of the vapor cell having an axis of rotation parallel to the first direction, a rotational orientation change having an axis of rotation parallel to the second direction, and a rotational orientation change having an axis of rotation parallel to the third direction from the nuclear spin component of the second element in the second direction and the nuclear spin component of the second element in the third direction.

2. A nuclear magnetic resonance (NMR) gyroscope comprising:
   a vapor cell configured to contain a mixture including at least one gaseous first element and at least one gaseous second element having non-negligible nuclear spin;
   a pump laser configured to generate a pump laser beam in a first direction to polarize electron spins of the first element in the vapor cell in a direction of polarization;
   a static magnetic field generator configured to generate a static magnetic field in the direction of polarization of the electron spins of the first element;
   a first alternating magnetic field generator configured to generate a magnetic field in a second direction perpendicular to the first direction at a frequency which corresponds to a Larmor frequency of a Larmor precession of nuclear spins of the second element around the static magnetic field;
   a measuring unit configured to measure a nuclear spin component of the second element in the second direction and a nuclear spin component of the second element in a third direction, which is perpendicular to the first direction and differs from the second direction; and
   an evaluation unit configured to determine a rotational orientation change having an axis of rotation parallel to the first direction, a rotational orientation change having an axis of rotation parallel to the second direction, and a rotational orientation change having an axis of rotation parallel to a third direction from the nuclear spin component of the second element in the second direction and from the nuclear spin component of the second element in the third direction.

3. The method as claimed in claim 1, wherein the first direction, the second direction, and the third direction each have an angle of 90° in relation to one another.

4. The method as claimed in claim 3, wherein:
   $k_2$ is the nuclear spin component of the second element in the second direction,
   $k_3$ is the nuclear spin component of the second element in the third direction,
   $\Omega_1(t)$ corresponds to the determined rotational orientation change having an axis of rotation parallel to the first direction,
   $\Omega_2(t)$ corresponds to determined rotational orientation change having an axis of rotation parallel to the second direction,
   $\Omega_3(t)$ corresponds to determined rotational orientation change having an axis of rotation parallel to the third direction,
   the determined rotational orientation having an axis of rotation parallel to the first direction, the determined rotational orientation change having an axis of rotation parallel to the second direction, and the determined rotational orientation change having an axis of rotation parallel to the third direction are obtained from:

$$\frac{\partial k_2(t)}{\partial t} = k_3(\gamma_k B_{DC} + 2\pi\Omega_1(t)) - k_1(0 + 2\pi\Omega_3(t)) - \Gamma_2 k_2,$$

-continued $$\frac{\partial k_3}{\partial t} = k_1(\gamma_k B_{AC}\sin(\omega_{drv}t) + 2\pi\Omega_2(t)) - k_2(\gamma_k B_{DC} + 2\pi\Omega_1(t)) - \Gamma_2 k_3, \text{ and}$$

$$\frac{\partial k_1}{\partial t} = k_2(0 + 2\pi\Omega_3(t)) - k_3(\gamma_k B_{DC}\sin(\omega_{drv}t) + 2\pi\Omega_2(t)) - \Gamma_1 k_1 + \Gamma_{se}s_1,$$

$\omega_{drv}$ corresponds to the frequency of the alternating magnetic field, $B_{DC}$ corresponds to the applied static magnetic field, $B_{AC}$ corresponds to an amplitude of the alternating magnetic field in the second direction, $\Gamma_1$ and $\Gamma_2$ correspond to population and coherence decay rates, $\Gamma_{se}$ describes spin exchange rate, which results in alignment of the nuclear spin of the second element via the exchange interaction with the electron spin of the first element, $k_1$ is the nuclear spin component of the second element in the first direction, and $\gamma_k$ describes a gyromagnetic ratio of the nuclear spin.

5. The method as claimed in claim 4, further comprising:
applying, with the first alternating magnetic field generator, a feedback magnetic field in the second direction that is controlled in such a way that an offset of the nuclear spin component of the second element in the second direction becomes zero,
wherein:
$B_{FB,2}(t)$ corresponds to the feedback magnetic field,
the rotational orientation change having an axis of rotation parallel to the second direction is ascertained, and
the rotational orientation change having an axis of rotation parallel to the second direction is determined from:

$$\Omega_2(t) = -\frac{\gamma_k}{2\pi}B_{FB,2}(t)$$

6. The method as claimed in claim 4, further comprising:
applying, with a second alternating magnetic field generator, a feedback magnetic field in the third direction that is controlled in such a way that an offset of the nuclear spin component of the second element in the third direction becomes zero,
wherein:
$B_{FB,3}(t)$ corresponds to the feedback magnetic field,
the rotational orientation change having an axis of rotation parallel to the third direction is ascertained, and
the rotational orientation change having an axis of rotation parallel to the third direction is determined from:

$$\Omega_3(t) = -\frac{\gamma_k}{2\pi}B_{FB,3}(t)$$

7. The method as claimed in claim 4, wherein the rotational orientation change having an axis of rotation parallel to the first direction is determined in that a frequency shift of the nuclear spin component of the second element in the second direction and/or the nuclear spin component of the second element in the third direction is equalized by changing the frequency of the alternating magnetic field applied in the second direction) in such a way that the frequency of the applied alternating magnetic field corresponds to a measured frequency of the nuclear spin component of the second element in the second direction and/or the nuclear spin component of the second element in the third direction.

8. The method as claimed in claim 3, wherein:
the measurement of the nuclear spin component of the second element in the third direction takes place in that a first linearly polarized evaluation laser beam radiates through the vapor cell in the third direction,
the first evaluation laser beam, after the radiation through the vapor cell, is incident on a polarizing beam splitter, which splits the first evaluation laser beam into a first transmitted beam and a first reflected beam, and
a first detector and a second detector are configured, so that the first transmitted beam is incident on the first detector, the first reflected beam is incident on the second detector, and a signal difference is determined.

9. The method as claimed in claim 8, wherein:
the measurement of the nuclear spin component of the second element in the second direction takes place in that a linearly polarized second evaluation laser beam radiates through the vapor cell in the second direction,
the second evaluation laser beam, after the radiation through the vapor cell, is incident on a polarizing beam splitter, which splits the second evaluation laser beam into a second transmitted beam and a second reflected beam,
a third and fourth detector are configured, so that the second transmitted beam is incident on the third detector, the second reflected beam is incident on the fourth detector, and another signal difference is determined.

10. The NMR gyroscope as claimed in claim 2, wherein the first direction, the second direction, and the third direction each have an angle of 90° in relation to one another.

11. The NMR gyroscope as claimed in claim 10, further comprising:
a second alternating magnetic field generator configured to apply a feedback magnetic field in the third direction, wherein $B_{FB,3}$ corresponds to the feedback magnetic field,
wherein the evaluation unit is further configured to apply the feedback magnetic field in the third direction, such that an offset of the nuclear spin component of the second element in the third direction becomes zero, and
the rotational orientation change having an axis of rotation parallel to the third direction is determined from:

$$\Omega_3(t) = -\frac{\gamma_k}{2\pi}B_{FB,3}(t)$$

12. The NMR gyroscope as claimed in claim 10, wherein:
$B_{FB,2}$ corresponds to a feedback magnetic field,
the evaluation unit is further configured to cause the first alternating magnetic field generator to apply the feedback magnetic field in addition to the alternating magnetic field in the second direction, such that an offset of the nuclear spin component in the second direction becomes zero, and
the rotational orientation change having an axis of rotation parallel to the second direction is determined from:

$$\Omega_2(t) = -\frac{\gamma_k}{2\pi}B_{FB,2}(t)$$

13. The NMR gyroscope as claimed in claim 10, wherein the evaluation unit includes has a phase-locked loop arrangement configured to determine the rotational orientation change having an axis of rotation parallel to the first direction in that a frequency shift of the nuclear spin component of the second element in the second direction and/or the nuclear spin component of the second element in the third direction is equalized by changing a frequency of the alternating magnetic field applied in the second direction in such a way that the frequency of the applied alternating magnetic field corresponds to a measured frequency of the nuclear spin component of the second element in the second direction and/or of the nuclear spin component of the second element in the third direction.

14. The NMR gyroscope as claimed in claim 10, further comprising:

a polarizing first beam splitter;
a first detector;
a second detector; and
a first evaluation laser configured to radiate through the vapor cell by generating a linearly polarized first evaluation laser beam in the third direction,
wherein the first evaluation laser beam, after radiating through the vapor cell, is incident on the polarizing first beam splitter, which splits the first evaluation laser beam into a first transmitted beam and a first reflected beam, and
wherein the first and the second detectors are configured, so that the first transmitted beam is incident on the first detector, and the first reflected beam is incident on the second detector.

15. The NMR gyroscope as claimed in claim 14, further comprising:

a polarizing second beam splitter;
a third detector;
a fourth detector; and
a second evaluation laser configured to radiate through the vapor cell by generating a linearly polarized second evaluation laser beam in the second direction,
wherein the second evaluation laser beam, after radiating through the vapor cell, is incident on the polarizing second first beam splitter, which splits the first evaluation laser beam into a second transmitted beam and a second reflected beam, and
wherein the third and the fourth detector are configured, so that the second transmitted beam is incident on the third detector, and the second reflected beam is incident on the fourth detector.

* * * * *